United States Patent
McCulloch et al.

(10) Patent No.: US 7,510,672 B2
(45) Date of Patent: Mar. 31, 2009

(54) FORMULATION FOR INK-JET PRINTING COMPRISING SEMICONDUCTING POLYMERS

(75) Inventors: Iain McCulloch, Southampton (GB); David Sparrowe, Southampton (GB); Maxim Shkunov, Southampton (GB); Phil Bentley, Cambridge (GB); Mark Giles, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 161 days.

(21) Appl. No.: 11/596,847

(22) PCT Filed: Apr. 22, 2005

(86) PCT No.: PCT/EP2005/004338
§ 371 (c)(1), (2), (4) Date: Nov. 17, 2006

(87) PCT Pub. No.: WO2005/112144
PCT Pub. Date: Nov. 24, 2005

(65) Prior Publication Data
US 2008/0067475 A1    Mar. 20, 2008

(30) Foreign Application Priority Data
May 18, 2004    (EP) ................... 04011711

(51) Int. Cl.
*H01B 1/00* (2006.01)
*H01B 1/12* (2006.01)
*C08G 75/00* (2006.01)
(52) U.S. Cl. ....................... 252/500; 528/373
(58) Field of Classification Search ........... 252/500; 528/373
See application file for complete search history.

(56) References Cited

U.S. PATENT DOCUMENTS

| | | | |
|---|---|---|---|
| 4,737,557 A | 4/1988 | Sato et al. |
| 5,069,823 A | 12/1991 | Sato et al. |
| 5,681,381 A | 10/1997 | Auslander et al. |
| 5,731,229 A | 3/1998 | Kato et al. |
| 5,814,376 A | 9/1998 | Cabelli |
| 6,166,172 A | 12/2000 | McCullough et al. |

(Continued)

FOREIGN PATENT DOCUMENTS

EP    0 779 348 A2    6/1997

(Continued)

OTHER PUBLICATIONS

Chen et al., "Improved electroluminescence performance of poly (3-alkylthiophene) having a high head-to-tail (HT) ratio," J. Mater. Chem., vol. 6, Issue 11, pp. 1763-1766 (1996).*

(Continued)

*Primary Examiner*—Mark Kopec
*Assistant Examiner*—Jaison P Thomas
(74) *Attorney, Agent, or Firm*—Millen, White, Zelano & Branigan, P.C.

(57) ABSTRACT

The invention relates to formulations comprising one or more polymers with semiconducting, charge transport, photoconducting and/or photo- or electroluminescent properties and one or more organic solvents, to their use for the preparation of electrooptical or electronic devices, including field effect transistors (FETs), electroluminescent, photovoltaic and sensor devices, in particular by ink-jet printing, and to FETs and other semiconducting or light emitting components or devices comprising the formulations.

19 Claims, 2 Drawing Sheets

U.S. PATENT DOCUMENTS

| | | | |
|---|---|---|---|
| 6,822,629 B2 * | 11/2004 | Yamazaki et al. | 345/76 |
| 6,879,099 B2 * | 4/2005 | Kihara et al. | 313/504 |
| 6,994,893 B2 | 2/2006 | Spreitzer et al. | |
| 7,252,781 B2 | 8/2007 | Spreitzer et al. | |
| 2001/0001050 A1 | 5/2001 | Miyashita et al. | |
| 2002/0041926 A1 | 4/2002 | Miyashita et al. | |
| 2002/0136823 A1 | 9/2002 | Miyashita et al. | |
| 2002/0155215 A1 | 10/2002 | Miyashita et al. | |
| 2003/0008429 A1 | 1/2003 | Yamazaki et al. | |
| 2003/0054186 A1 | 3/2003 | Miyashita et al. | |
| 2003/0111666 A1 | 6/2003 | Nishi et al. | |
| 2003/0116772 A1 | 6/2003 | Yamazaki et al. | |
| 2004/0021413 A1 | 2/2004 | Ito | |
| 2005/0042477 A1 | 2/2005 | Miyashita et al. | |

FOREIGN PATENT DOCUMENTS

| | | |
|---|---|---|
| EP | 0 880 303 A | 11/1998 |
| EP | 1 083 775 A | 3/2001 |
| EP | 1 211 916 A1 | 6/2002 |
| EP | 1 376 716 A2 | 1/2004 |
| EP | 1 376 717 A2 | 1/2004 |
| JP | 02309616 A2 | 12/1990 |
| WO | WO 98/24271 A1 | 6/1998 |
| WO | WO 99/39373 A2 | 8/1999 |
| WO | WO 01/47045 A1 | 6/2001 |
| WO | WO 02/072714 A1 | 9/2002 |
| WO | WO 03/019694 A2 | 3/2003 |

OTHER PUBLICATIONS

Shin et al., "Effect of alkyl side-chain length and solvent on the luminescent characteristics of poly(3-n-alkythiophene)," Synthetic Metals, vol. 140, pp. 177-181 (2004).*

Carter, J.C. et al., <<Recent developments in materials and processes for ink jet printing high resolution polymer OLED displays,>> Database Inspec 'Online !' The Institution of Electrical Engineers, 2003, Stevenage, GB, XP002333830, DB accession No. 7693500.

Carter, J.C. et al., Organic Light-Emitting Materials and Devices IV8—Jul. 10, 2002; Seattle, WA, USA, Proceedings of the SPIE—The International Society for Optical Engineering, vol. 4800, Feb. 2003, pp. 34-46, XP002333829.

Speakman, S.P. et al., <<High Performance Organic Semiconducting Thin Films: Ink Jet Printed Polythiophene ARR-P3HTU,>> Organic Electronics, vol. 2 No. 2, Sep. 2001, pp. 65-73, Elsevier: Amsterdam, NL. XP00110421.

Ullmann, A. et al. <<High Performance Organic Field-Effect Transistors and Integrated Inverters,>> Materials Research Society Symposium Proceedings, Materials Research Society, vol. 665, Apr. 20, 2001, pp. 265-270; Pittsburgh, PA, USA. XP008032774.

* cited by examiner

FORMULATION FOR INK-JET PRINTING COMPRISING SEMICONDUCTING POLYMERS

FIELD OF INVENTION

The invention relates to formulations comprising one or more polymers with semiconducting, charge transport, photoconducting and/or photo- or electroluminescent properties and one or more organic solvents. The invention further relates to the use of the formulations for the preparation of electrooptical or electronic devices, including field effect transistors (FETs), electroluminescent, photovoltaic and sensor devices, in particular by ink-jet printing. The invention further relates to FETs and other semiconducting or light-emitting components or devices comprising the formulations.

BACKGROUND AND PRIOR ART

Organic materials with semiconducting or charge-transport properties have recently shown promise as the active layer in organic based thin film transistors (TFT) and organic field effect transistors (OFETs) [see H. E. Katz, Z. Bao and S. L. Gilat, *Acc. Chem. Res.*, 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

Furthermore, these organic materials have been proposed for use in light-emitting and electroluminescent (EL) devices like organic light-emitting diodes (OLED).

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ cm$^2$V$^{-1}$s$^{-1}$). In addition, it is important that the semiconducting material is relatively stable to oxidation i.e. it has a high ionisation potential, as oxidation leads to reduced device performance.

In prior art polythiophene (PT), for example regioregular head-to-tail (HT) poly-(3-alkylthiophene) (PAT), in particular poly-(3-hexylthiophene) (PHT), has been suggested for use as semiconducting material, as it shows charge carrier mobility between $1\times10^{-5}$ and 0.1 cm$^2$V$^{-1}$s$^{-1}$. Also, PAT shows good solubility in organic solvents and is solution processable to fabricate large area films.

In order to fabricate TFT, OFET and OLED devices usually low cost, solution based, additive processes are used. For example, ink-jet printing of solutions of electroluminescent or semiconducting polymers has been suggested in prior art as a suitable method.

For this purpose it is necessary to prepare stable inks or formulations of the polymeric semiconductor material. These polymers, like for example the commonly used PAT, however, do generally have solubility problems for two main reasons.

Firstly, semiconducting polymers require a conjugated component, generally the backbone, to confer the appropriate electronic bandgap. This backbone usually contains a high degree of aromatic hydrocarbon and heterocyclic rings, which tend to limit the solubility in coating solvents. Introduction of solubilising groups, like for example the alkyl-groups in case of PAT, has the effect of both diluting the electronically active fraction of the material, thus lowering the electrical performance, and may additionally trap charge, depending on the functional groups used. These groups are generally therefore only incorporated sparingly into the polymer structure.

Secondly, charge transport polymers are molecularly designed to facilitate intermolecular charge hopping, which is enhanced by close packing and aggregation of the polymer chains. When this happens in solution, gelling occurs, which, if irreversible, leads to filtration and coating problems.

Therefore, there is a need to provide suitable compositions or formulations comprising semiconducting polymers like PAT which are suitable for the preparation of electronic and EL devices like TFTs, OFETs and OLEDs, in particular by ink-jet printing.

Compositions or formulations comprising semiconducting polymers and organic solvents have been described in prior art.

U.S. Pat. Nos. 5,069,823 and 4,737,557 disclose PAT and methods of its preparation and also mention solutions of PAT in tetralin.

US 2003/116772 A1 discloses the fabrication of a light-emitting device from an organic light-emitting compound dissolved in a solvent by coating methods. As possible organic compound the reference generally discloses polymers such as PT, PPV, PP or PF are disclosed. As possible solvents the reference generally mentions toluene, benzene, (di)chlorobenzene, chloroform, tetralin, xylene, DCM, cyclohexane, NMP, DMSO, cyclohexanone, dioxane, THF and the like.

U.S. Pat. No. 5,814,376 discloses a gravure coating process for forming a film of an electroconductive polymer on a substrate. As possible polymer polyacetylene, polypyrrole, PT, PAT, polyphenylene sulfide, PPV, polythienylene vinylene, polyphenylene (PP), polyisothianaphthene, polyazulene, polyfuran or polyaniline are generally mentioned. As possible solvents chloroform, toluene, xylene, THF, DCM and tetralin are generally mentioned. Example 6 further discloses a mixture of PHT in a solvent mixture of toluene/xylene/indane 85/10/5.

However, the above documents do not mention the preparation of semiconducting or EL devices by ink-jet printing. Nor do they provide any technical teaching how to select the solvents and polymers in order to improve the print performance.

EP 0 880 303 A1 discloses a method of producing an organic EL device by ink-jet printing of a liquid composition including an organic emitting polymer like for example PAT, polyphenylenevinylene (PPV) or polyfluorene (PF). The reference further mentions some desired properties of the compositions like viscosity and surface tension, however, the disclosed ranges are very broad and do not provide a technical teaching how to select suitable solvents. There is no disclosure or suggestion for specific suitable solvents that can be used in the compositions.

WO 99/39373 A2 discloses a method of fabricating semiconductor devices by depositing a semiconducting material in a solvent onto a substrate by ink-jet printing. However, the reference does specifically disclose only a solution of polyvinylcarbazole (PVK) and light-emitting dyes in chloroform.

WO 01/47045 A1 discloses a method of forming an electronic device on a substrate from electrically conductive or semiconductive materials mixed with a liquid, wherein the mixture may, among other methods, also be deposited on the substrate by ink-jet printing. As semiconductive materials PHT, PF or copolymers of fluorene and thiophene are disclosed, and as solvents mixed xylenes.

US 2003/008429 A1 discloses a method of fabrication of a light-emitting device using ink-jet printing of a composition comprising an organic light-emitting compound and a solvent. As possible organic compound polymers like PPV, PT, (PF), polyparaphenylene (PPP), polyalkylphenylene or polyacetylene are generally mentioned. As possible solvents toluene, benzene, (di)chlorobenzene, chloroform, tetralin, xylene, anisole, dichloromethane (DCM), γ-butyrolactone, cyclohexane, N-methyl-2-pyrrolidone (NMP), dimethyl sulfoxide (DMSO), cyclohexanone, dioxane, tetrahydrofuran (THF) or the like are generally mentioned. However, there is no technical teaching how to select the solvents and polymers in order to improve the print performance. Embodiment 3 describes a light emitting layer formed by ink-jet printing of a solution of PVK and a light-emitting metal chelate complex without specifying the solvent.

WO 02/72714 A1 discloses solutions and dispersions comprising an organic semiconductor and a mixture of at least two solvents, wherein these solvents have a boiling point of less than 200° C. and a melting point of 15° C. or less, do not comprise benzylic CH$_2$— or CH— groups, are no benzene derivatives with tert butyl or more than two methyl substituents, and at least one of these solvents has a boiling point of between 140° C. and 200° C. As semiconductors substituted polyarylenevinylenes (PAV), PFs, polyspirobifluorenes (PSF), polyparaphenylenes (PPP), PTs, polypyridines (PPy), polypyrroles, PVKs and polytriarylamines are mentioned. As preferred solvents for example xylol, anisol, toluol and their fluorinated, chlorinated or methylated derivatives are mentioned, whereas tetralin is reported as being unsuitable.

EP 1 083 775 A1 discloses a composition for use in the preparation of organic EL devices by ink-jet printing. The composition comprises an organic EL material and a first solvent comprising at least one substituted benzene derivative having a substituent with at least 3 carbon atoms, and preferably having a boiling point of at least 200° C., or a mixture of said first solvent with a second solvent having a boiling point of 140° C. or higher. As possible EL material polymers like PPV, PP, PT, PF or PVK are generally mentioned. As solvents, among others, cumene, cymene, cyclohexylbenzene, several alkylated benzenes, tetralin or mixtures thereof are proposed. Especially preferred are dodecylbenzene and 1,2,3,4-tetramethylbenzene. Specifically mentioned are furthermore mixtures of tetralin with xylene, dodecylbenzene or 1,2,3,4-tetramethylbenzene.

However, the formulations described in prior art have several drawbacks. For example, in case of solutions of polythiophene in chlorinated solvents like chloroform or trichlorobenzene, over time the solvents have been demonstrated to degrade the polythiophene backbone, thus lowering its electrical performance. In addition, chloroform is too volatile and prematurely evaporates during processing leading to coating irregularities, dispensing problems, loss of resolution and feature definition, as well as clogging of, for example, ink-jet heads. The solubility of polymers like for example polythiophene in toluene and xylene, on the other hand, is often not high enough to provide sufficient ink viscosity, nor can these solvents achieve a high enough surface tension for reliable ink-jet printing.

Therefore, there is a need for improved solutions and formulations of semiconducting polymers, in particular polythiophenes like 3-alkyl polythiophene (PAT), which do not have the drawbacks of prior art materials as described above, and which are suitable for processing the polymer in particular when manufacturing electronic or electrooptic devices like thin film organic transistors.

It was an aim of the present invention to provide improved formulations and inks, in particular solutions, that do not have the drawbacks of prior art materials mentioned above and are suitable for preparation of electronic, electrooptic and light-emitting devices in particular by ink-jet printing, in an economical, effective and environmentally beneficial way which is especially suitable for industrial large scale production.

Other aims of the present invention are immediately evident to the person skilled in the art from the following detailed description.

The inventors of the present invention have found that these aims can be achieved and the above problems can be solved by providing formulations of semiconducting polymers as described below.

SUMMARY OF THE INVENTION

The invention relates to a formulation comprising one or more polymers with semiconducting, charge-transport, photoconducting and/or photo- or electroluminescent properties and one or more solvents selected from the group comprising solvents with a surface tension of from 30 to 40, preferably from 32 to 40 dynes/cm, a boiling temperature of 160° C. or higher, and preferably a viscosity of less than 3 mPa·s.

The invention further relates to a formulation comprising one or more polymers with semiconducting or charge-transport properties and one or more solvents, wherein the polymer concentration is ≦10% by weight, preferably wherein the formulation has a viscosity of less than 6 mPa·s and/or the polymer concentration is ≦3% by weight.

The invention further relates to a formulation comprising one or more polymers with semiconducting or charge-transport properties and a solvent or a mixture of solvents selected of formula I

I wherein X is —CH$_2$— or —CH$_2$—CH$_2$—.

The invention further relates to a formulation comprising one or more polymers with semiconducting or charge-transport properties and one or more solvents as described above for use as printing ink, in particular for ink-jet printing.

The invention further relates to the use of a formulation as described above and below for the manufacture of semiconducting devices, in particular of thin film organic transistors.

The invention further relates to a semiconductor or charge transport material, component or device obtained from a formulation as described above and below.

The invention further relates to the use of the formulation as described above and below for the preparation or processing of materials, components or devices that have charge-transport, semiconducting, electrically conducting, photoconducting or light-emitting properties and can be used in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, photovoltaic or sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, cosmetic or pharmaceutical compositions or for detecting and discriminating DNA sequences.

The invention further relates to an optical, electrooptical or electronic device, FET, integrated circuit (IC), TFT or OLED obtained from a formulation or from a semiconducting or charge transport material, component or device as described above and below.

The invention further relates to a TFT or TFT array for flat panel displays, radio frequency identification (RFID) tag, electroluminescent display or backlight comprising a formulation, semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

The formulations and solutions according to the present invention are especially suitable as printing inks for the production of thin films of polythiophene in semiconducting components or devices using printing processes, most preferably by ink jet printing.

Therefore, the solvents used in the formulations according to the present invention should especially preferably be suitable for ink jet printing, as their physical properties will determine many of the physical properties of the final fluid.

It was found that optimum results for ink-jetting could be obtained if the physical properties of the solvents are as follows:

a moderate surface tension, preferably 32 dynes/cm or more, very preferably 34 dynes/cm or more and less than 40 dynes/cm, a viscosity as low as possible to ensure that high levels of the highly viscous, solid polymeric material can be included in the formulation; on the other hand, high solvent viscosities are tolerable if the solids content of the formulation is very low, preferably a viscosity of less than 4 mPa·s, very preferably from 1 to 3 mPa·s.

a solvency of the polymeric material that is as high as possible, to minimise precipitation of solid material in the print head, good compatibility with the selected print head, i.e. the solvent should not attack or swell any component, not be excessively aggressive, as adhesives in the print head can be attacked.

a boiling point above 80° C., preferably above 130° C., very preferably above 160° C. Lower boiling temperatures can seriously compromise jetting performance due to extremely short dwell times. Thus, in drop-on-demand print heads the nozzles are open to the atmosphere and so, when not printing the solvent will evaporate causing an increase in the fluid viscosity around the nozzles. The viscosity of this fluid will eventually reach a point where the droplet velocity and/or trajectory is affected resulting in miss-placed drops—the time taken before this is observed is called the "latency" of the ink. If left for a further period of time the solid material in the ink can precipitate out and cause clogging of the nozzles which may need mechanical means to regain jetting—the time up until mechanical intervention is needed to regain jetting is called the "dwell time".

Also, the formulation should have stable physical properties over time, otherwise the jetting properties will vary significantly due to variations in the visco-elastic behaviour of the formulation.

The inventors have found that printing inks with particularly good performance can be obtained when using a polythiophene as described above and below together with a solvent or a mixture of solvents with a surface tension of at least 30, preferably at least 32, very preferably at least 34, most preferably at least 35 dynes/cm and not more than 50, very preferably not more than 40 dynes/cm The solubility of the polythiophene in the solvent should be at least 0.2% by weight.

The boiling temperature of the solvent should be preferably 100° C., very preferably 160° C. or higher, most preferably 170° C. or higher The viscosity of the solvent should preferably be less than 4 mPa·s, very preferably less than 3 mPa·s.

The viscosity of the formulation comprising the polythiophene and the solvent should preferably be less than 10 mPa·s, very preferably less than 6 mPa·s, most preferably 4 mPa·s or less and preferably higher than 0.5 mPa·s, very preferably higher than 1 mPa·s, most preferably higher than 1.15 mPa·s).

Thus, further preferred embodiments of the present invention relate to a formulation comprising polythiophene and comprising an organic solvent or a mixture of two or more solvents having one or more of the aforementioned properties.

The concentration of the polythiophene in the organic solvent is preferably ≦20%, very preferably ≦10%, particularly preferably ≦5%, most preferably ≦3% by weight. Furthermore, the concentration of the polythiophene in the organic solvent is preferably ≧0.2%, very preferably ≧0.5%, most preferably ≧1.0% by weight.

The formulations according to the present invention can contain further additives like e.g. co-solvents and surfactants, furthermore lubricating agents, wetting agents, dispersing agents, hydrophobing agents, adhesive agents, flow improvers, defoaming agents, deaerators, diluents, auxiliaries, colourants, dyes or pigments.

The formulation according to the present invention is preferably a solution or dispersion, very preferably a solution.

Especially preferred are solvents of formula I above. Formula I covers the compounds dihydroindene (indan) of formula I1 and 1,2,3,4-tetrahydronaphthalene (tetralin) of formula I2

I1

The polymers are preferably selected from polyphenylenevinylene (PPV), polyarylenevinylene (PAV), polyfluorene (PF), polyspirobifluorene (PSF), polyparaphenylene (PPP), polypyridine (PPy), polypyrrole, polyvinylcarbazole, polytriarylamine and copolymers of the above. Especially preferred are polythiophenes.

Very preferably the polymers are selected from poly-3-substituted thiophenes of formula II wherein n is an integer >1 and $R^1$ is H, halogen, straight chain, branched or cyclic alkyl with 1 to 20 C-atoms, which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —$SO_2$—, —S—CO—, —CO—S—, —$CY^1$=$CY^2$— or —C≡C— in such a manner that O and/or S atoms are not linked directly to one another, optionally substituted aryl or heteroaryl, or P-Sp, with

- $R^0$ and $R^{00}$ being independently of each other H or alkyl with 1 to 12 C-atoms,
- $Y^1$ and $Y^2$ being independently of each other H, F, Cl or CN,
- P being a polymerisable or reactive group which is optionally protected, and
- Sp being a spacer group or a single bond.

The polymers according to the present invention are especially preferably regioregular HT-poly-(3-substituted) thiophenes. The regioregularity (=head-to-tail couplings divided by the total couplings, and expressed as a percentage), in these polymers is preferably at least 85%, in particular 90% or more, very preferably 95% or more, most preferably from 98 to 100%.

Regioregular poly-(3-substituted) thiophenes are advantageous as they show strong interchain pi-pi-stacking interactions and a high degree of crystallinity, making them effective charge transport materials with high carrier mobilities, as described for example in U.S. Pat. No. 6,166,172.

The polymers according to the present invention preferably have a degree of polymerisation (or number n of recurring units) from 2 to 5000, in particular from 10 to 5000, very preferably from 50 to 1000.

Further preferred are polymers having a molecular weight from 5000 to 300,000, in particular from 10,000 to 100,000.

The formulations can comprise one polymer or a mixture of two or more polymers. Especially preferred are formulations comprising one polymer.

$R^1$ is preferably selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, optionally substituted aryl or heteroaryl, or P-Sp-, in particular $C_1$-$C_{20}$-alkyl or $C_1$-$C_{20}$-fluoroalkyl, preferably straight-chain groups.

Very preferred is poly-3-alkylthiophene (hereinafter also referred to as PAT3), i.e. a polymer of formula II wherein $R^1$ is alkyl, most preferably straight-chain alkyl, preferably having 1 to 12 C-atoms, most preferably having 4, 5, 6, 7 or 8 C-atoms. Most preferred is poly-3-hexyl thiophene.

If $R^1$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If $R^1$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If $R^1$ is thioalkyl, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If $R^1$ is fluoroalkyl, it is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

Another preferred embodiment of the present invention relates to a formulation comprising polythiophene that is substituted in 3-position with a polymerisable or reactive group, which is optionally protected during the process of forming the polythiophene. Particular preferred polymers of this type are those of formula II wherein $R^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Very preferably the polymerisable or reactive group P is selected from $CH_2$=$CW^1$—COO—, $CH_2$=$CW^1$—CO—, $CH_2$=$CW^2$—(O)$_{k1}$—, $CH_3$—CH=CH—O—, ($CH_2$=CH)$_2$CH—OCO—, ($CH_2$=CH—$CH_2$)$_2$CH—OCO—, ($CH_2$=CH)$_2$CH—O—, ($CH_2$=CH—$CH_2$)$_2$N—, $(CH_2=CH-CH_2)_2N-CO-$, $HO-CW^2W^3-$, $HS-CW^2W^3-$, $HW^2N-$, $HO-CW^2W^3-NH-$, $CH_2=CW^1-CO-NH-$, $CH_2=CH-(COO)_{k1}$-Phe-$(O)_{k2}-$, $CH_2=CH-(CO)_{k1}$-Phe-$(O)_{k2}-$, Phe-$CH=CH-$, $HOOC-$, $OCN-$, and $W^4W^5W^6Si-$, with $W^1$ being H, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1.

Especially preferred groups P are $CH_2=CH-COO-$, $CH_2=C(CH_3)-COO-$, $CH_2=CH-$, $CH_2=CH-O-$, $(CH_2=CH)_2CH-OCO-$, $(CH_2=CH)_2CH-O-$, Polymerisation of group P can be carried out according to methods that are known the expert and described in the literature, for example in D. J. Broer; G. Challa; G. N. Mol, *Macromol. Chem*, 1991, 192, 59.

As spacer group Sp all groups can be used that are known for this purpose to the skilled in the art. The spacer group Sp is preferably of formula -Sp'-X'—, such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by $-O-$, $-S-$, $-NH-$, $-NR^0-$, $-SiR^0R^{00}-$, $-CO-$, $-COO-$, $-OCO-$, $-OCO-O-$, $-S-CO-$, $-CO-S-$, $-CH=CH-$ or $-C\equiv C-$ in such a manner that O and/or S atoms are not linked directly to one another, X' is $-O-$, $-S-$, $-CO-$, $-COO-$, $-OCO-$, $-O-COO-$, $-CO-NR^0-$, $-NR^0-CO-$, $-NR^0-CO-CR^{00}-$, $-OCH_2-$, $-CH_2O-$, $-SCH_2-$, $-CH_2S-$, $-CF_2O-$, $-OCF_2-$, $-CF_2S-$, $-SCF_2-$, $-CF_2CH_2-$, $-CH_2CF_2-$, $-CF_2CF_2-$, $-CH=N-$, $-N=CH-$, $-N=N-$, $-CH=CR^0-$, $-CY^1=CY^2-$, $-C\equiv C-$, $-CH=CH-COO-$, $-OCO-CH=CH-$ or a single bond, $R^0$ and $R^{00}$ are independently of each other H or alkyl with 1 to 12 C-atoms, and $Y^1$ and $Y^2$ are independently of each other H, F, Cl or CN.

X' is preferably $-O-$, $-S-$, $-OCH_2-$, $-CH_2O-$, $-SCH_2-$, $-CH_2S-$, $-CF_2O-$, $-OCF_2-$, $-CF_2S-$, $-SCF_2-$, $-CH_2CH_2-$, $-CF_2CH_2-$, $-CH_2CF_2-$, $-CF_2CF_2-$, $-CH=N-$, $-N=CH-$, $-N=N-$, $-CH=CR^0-$, $-CY^1=CY^2-$, $-C\equiv C-$ or a single bond, in particular $-O-$, $-S-$, $-C\equiv C-$, $-CY^1=CY^2-$ or a single bond. In another preferred embodiment X' is a group that is able to form a conjugated system, such as $-C\equiv C-$ or $-CY^1=CY^2-$, or a single bond.

Typical groups Sp' are, for example, $-(CH_2)_p-$, $-(CH_2CH_2O)_q-CH_2CH_2-$, $-CH_2CH_2-S-CH_2CH_2-$ or $-CH_2CH_2-NH-CH_2CH_2-$ or $-(SiR^0R^{00}-O)_p-$, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The formulations, inks and solutions of the present invention are useful for the preparation of charge transport or semiconducting components or devices like OFETs, IC components, RFID tags or TFT applications. Moreover, they can be used for the preparation of electro- or photoluminescent or light-emitting components or devices like OLEDs for display or lighting use, e.g. as backlights of LCDs. They can also be used in photovoltaic, sensor or memory devices, charge injection layers, Schottky diodes, planarising layers, antistatic films, conducting substrates or patterns, electrode materials in batteries, photoconductors, electrophotographic applications, electrophotographic recording, alignment layers, cosmetic or pharmaceutical compositions or for detecting and discriminating DNA sequences.

The formulations of the present invention are especially useful for the preparation of organic field effect transistors (OFETs). Such OFETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the advantageous properties of the formulations according to the invention and thus the processibility of large surfaces, preferred applications of these FETs are such as integrated circuitry, TFT-displays and security applications.

Organic field effect transistors can be fabricated by ink jet printing techniques, photopatterning, micromoulding, screen printing, gravure and other contact printing techniques. Suitable and preferred methods and equipment are described in prior art and are known to the expert. In all cases, it is important to control the solvent evaporation rate to promote macroscopic organisation, while ensuring that the solvent can be facily removed at moderate temperatures in particular less than 200° C.

In security applications, field effect transistors and other devices with semiconductive materials, like transistors or diodes, may be used for RFID tags or security markings to authenticate and prevent counterfeiting of documents of value like banknotes, credit cards or ID cards, national ID documents, licenses or any product with money value, like stamps, tickets, shares, cheques etc.

Alternatively, the formulations according to the invention may be used for the production of organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The formulations according to the invention may be employed in one or more of the charge transport layers and/or in the emission layer, corresponding to their electrical and/or optical properties. Furthermore their use within the emission layer is especially advantageous, if the polymers according to the invention show electroluminescent properties themselves or comprise electroluminescent groups or compounds. The selection, characterization as well as the processing of suitable polymeric materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

The examples below serve to illustrate the invention without limiting it. In the foregoing and the following, all temperatures are given in degrees Celsius, and all percentages are by weight, unless stated otherwise.

The values of viscosity and surface tension, unless stated otherwise, refer to a temperature of 25° C. Formulation viscosities are obtained using an automated microviscometer (available for example from Anton Paar GmbH, Graz, Austria), which is based on the rolling/falling ball principle. A capillary is used in which a small metal ball rolls and by tilting this one way or the other the ball will descent through the liquid and can be timed. The length of time taken to pass a set distance through the liquid is proportional to the viscosity and the angle at which the tube is held at during this determines the shear rate of the measurement—which, for a Newtonian liquid, should not affect the recorded viscosity. The surface tensions reported are those of the pure solvent and can be found in the literature, like for example in the Rubber Handbook. Measurement of the surface tensions can be achieved by tensiometry, using a surface tension balance (White Torsion Balance) with a DuNouy ring.

EXAMPLE 1

Formulations were prepared from poly(3-hexyl)thiophene (PHT) with a molecular weight of 10,000 and a regioregularity of 96% in different solvents as shown in the table below, and the solubility and gelling behaviour of the polymer were tested.

| Solvent | Boiling Point (° C.) | Surface Tension (dynes/cm) | Properties of polymer |
| --- | --- | --- | --- |
| Tetralin | 207 | 34 | Soluble, heat required to rapidly dissolve, small amount of gelling over a few days |
| Indane | 176 | 35 | |
| 1,2,5-Trichlorobenzene | 208 | 27 | Soluble, little gelling over time, but remains a red/brown colour |
| Diethylbenzene | 181 | 30.5 | Poor solubility, heat required and showed very bad gelling over few hours |
| Xylene | 140 | 27.5 | |
| Anisole | 154 | 32.5 | Very bad solubility |
| Methylanisole | 174 | 31 | Very bad solubility |

Although anisole and methylanisole have reasonably high boiling points and surface tensions that are higher than the equivalent non-oxygenated aromatic, they showed only a very poor solubilization for the polymer which is insufficient for ink-jet use.

Xylene and diethylbenzene provided satisfactory polymer solubility if heated, however, the fluids gelled very rapidly, turning from a fluorescent orange to a non-fluorescent viscous gel that liquefied under a small amount of shear. This rapid aggregation which gives rise to a significant rise in viscosity would prevent stable jetting over time unless the print head was heated to a high enough temperature to prevent this phenomena. Unfortunately, this would have the significant disadvantage of decreasing dwell due to the accelerated evaporation of solvent at the nozzles and would decrease the viscosity further which would impact the jetting performance of what is, at room temperature, already a very low viscosity fluid.

1,2,5- trichlorobenzene (TCB) shows good solubilization of the polymer and has a high boiling point. However, it has only moderate surface tension. Also, its aggressive nature, toxicity and environmental problems, and possible problems over the long term stability of the polymer in this solvent, make it less suitable for ink-jet printing.

Therefore, of the above solvents only tetralin and indane showed a satisfactory combination of high boiling point, surface tension, solubility and little gelling of the polymer.

EXAMPLE 2

Formulations were prepared from the PHT of example 1 in tetralin and indane at different concentrations as shown in the table below. For comparison a formulation of the PHT in a solvent mixture tetralin/toluene (50/50) was prepared.

| Formulation No. | Solvent | PHT (wt. %) | viscosity (mPa · s) |
| --- | --- | --- | --- |
| 1a | tetralin | 1.0% | 2.53 |
| 1b | tetralin | 2.0% | 3.62 |
| 1c | indane | 1.0% | 1.72 |
| 2 | toluene/tetralin | 1.0% | 1.28 |

EXAMPLE 3

Use Example

The formulations 1a-c and 2 were tested for use as printing inks.

A) To test the priming performance the inks were loaded into a Spectra SX-128 ink-jet printhead (available from Spectra Inc., NH, USA). The head reservoir was half filled with ink (about 10 ml); ink was primed through the nozzles using a single purge at a pressure of 5.5 PSI for 5 seconds (a standard purge on the Spectra Apollo system).

B) To investigate jetting properties and droplet formation under different driving conditions, the formulations were loaded into the Spectra SX Special print head and then jetted using a variety of firing voltages, frequencies and waveforms.

C) To investigate the dwell performance of the inks the head was first primed and drops were jetted—images of these were recorded. The head was then left for a set length of time, either 5 or 30 minutes without firing. After this time the head was fired and images immediately recorded at different delays. These images can be compared against each other at each delay setting to check for differences that could be due to dwell effects, i.e. crusting of the nozzles plate.

D) To investigate the image quality of jetted droplets, the inks were jetted onto a non-porous, moving Melinex polyester substrate at a firing frequency of 1 kHz, throw distances of 0.5, 1 and 2 mm and a table speed of 20 m/min.

Results:

A) Priming

In case of inks 1a and 1b a single purge was all that was required to successfully prime all the nozzles. No problems with air entrapment in the tubing or printhead channels/nozzles were encountered. For ink 1c the priming properties were similar to ink 1a except that two purges were required to fully prime the print head and get all nozzles firing.

In case of ink 2 comprising tetralin and toluene priming was quite difficult. Several purges were required to get all nozzles firing.

B) Jetting Properties and Droplet Formation

The inks 1a-c could be jetted reliably through the print head. The best overall performance was seen for ink 1b, where the high frequency performance was extended up to 10 kHz. At present ink jet printing platforms designed for the deposition of electronic materials are usually limited to jetting up to a maximum of 2 kHz.

Optica images were used to characterise the jetting behaviour and droplet formation. Optica (available from VisionJet, Royston, UK) is an instrument using a high definition CCD camera and strobe arrangement for jet and droplet visualization.

Figure 1:
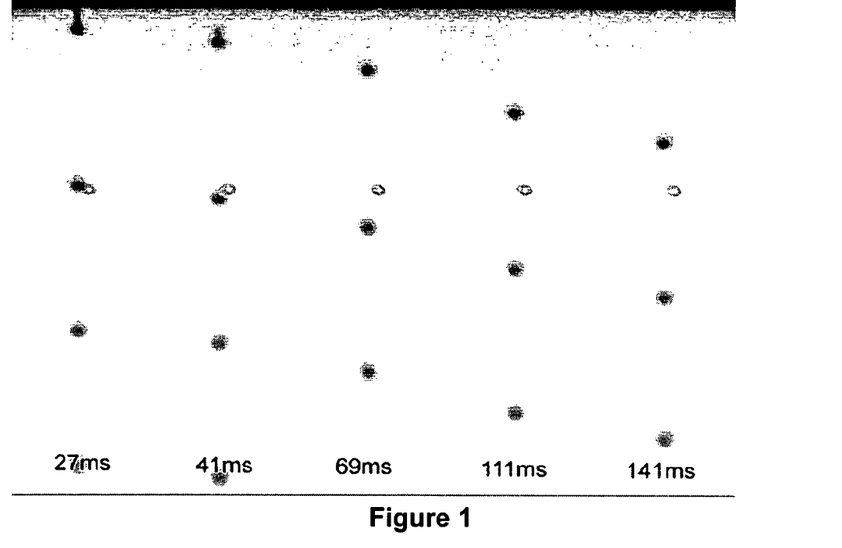
FIG. 1 depicts Optica images showing the droplet ejection process after ink-jet printing of a formulation according to the present invention.

The Optica images demonstrate excellent droplet shapes for inks 1a-1c when driven using the optimum waveforms and voltages with high drop-to-drop reproducibility of the fluids and driving conditions, with good reproducibility and without any observable droplet shape variation. This can be seen from FIG. 1 which is a montage of Optica images showing the droplet ejection process for ink 1b driven at 2 kHz and 60V with a 8_2_2 waveform.

Furthermore, a Genie system was used to investigate individual drops and further characterise the jetting behaviour of the inks. Genie (available from VisionJet, Royston, UK) is a laser based droplet measurement system incorporating versatile print head drive electronics.

The measurements were carried out at a throw distance of 500 µm. The advantage of the Genie over the Optica system is its ability to record data for each droplet jetted rather than an average image of around a hundred, as recorded by the Optica. This ability to characterise every jetted droplet allows us to easily understand if a particular ink and driving conditions gives reliable jetting. The Genie characterisation system is comprised of two laser sheets that are positioned a known distance apart, which are then placed in front of the print head such that the ejected droplets fire through them. The shadow cast by the droplets as they pass through each sheet is recorded by two photodiodes (channel A and B) and this signal is plotted against sample number (effectively equivalent to time). The Genie images show the response from channel A and B for one droplet and then a compound image of 30 droplets. The single image shows the peak due to channel A (closest to the print head) occur before the peak in channel B (furthest from the print head). The multiple images dramatically demonstrate the reliability of the ink and driving conditions, unreliable inks have unpredictable droplet formation from drop to drop. Reliable jetting conditions give traces that overlap perfectly.

Figure 2:
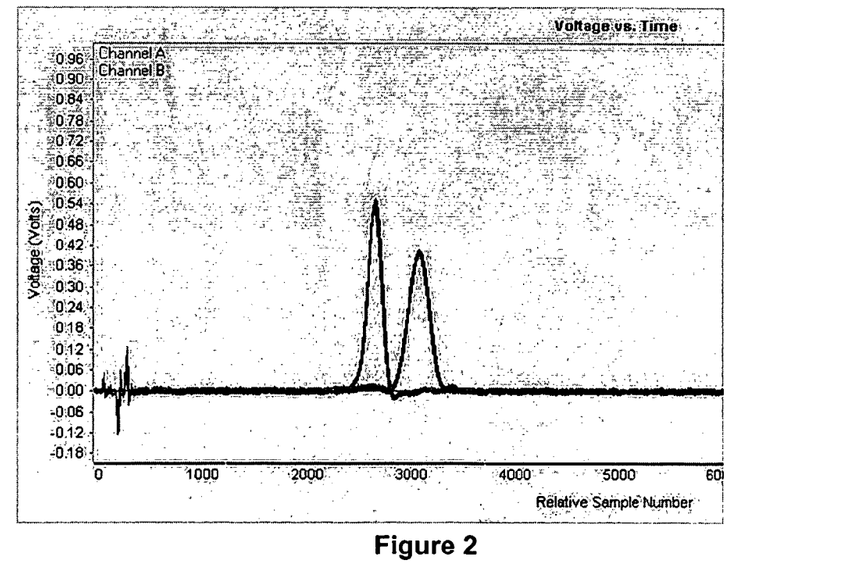
FIG. 2 depicts a Genie image showing the droplet ejection process after ink-jet printing of a formulation according to the present invention.

FIG. 2 shows a Genie image for ink 1a driven at 2 kHz and 60V with a 8_2_2 waveform, showing the response from channel A and B for a compound image of 30 droplets. As can be seen from FIG. 2 a high drop-to-drop reproducibility was achieved.

In contrast, for ink 2 comprising tetralin and toluene stable jetting was difficult to achieve for all drive conditions.

C) Dwell Performance

Dwell and continuous printing of inks 1a-c were excellent. Dwell experiments could be run up to 1 hour with immediate start-up and no observable variation in droplet shape. No start-up issues were observed up to 30 mins. This is extremely important for electronic applications as a short dwell will increase the necessary amount of maintenance and can increase the occurrence of jet skew due to build-up of solid material around the nozzles For ink 1a continuous printing could be demonstrated up to 1 hour with the loss of no channels across the 128 channel print head and no observable difference in droplet shape.

Figure 3:
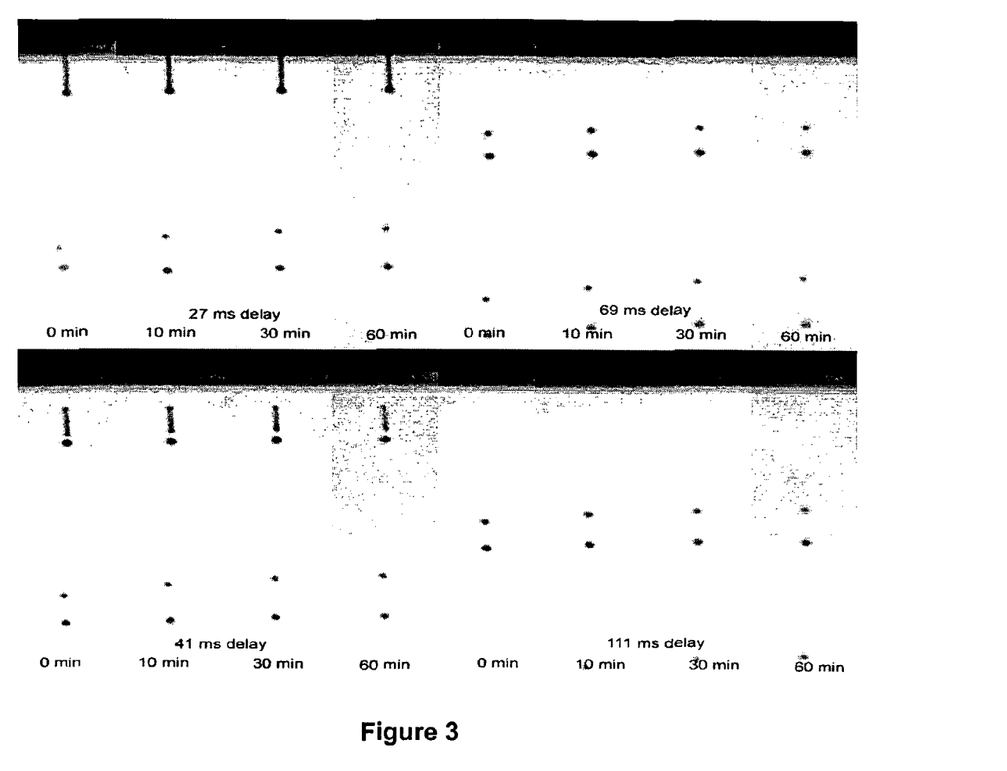
FIG. 3 depicts Optica images demonstrating the continuous print performance when ink-jet printing a formulation according to the present invention after different times.

FIG. 3 shows images of the continuous print performance of ink 1b at 8 kHz, 80V, 8_2_2 waveform after indicated time. It can be seen that the dwell performance is excellent as no difference in droplet shape or velocity could be observed even at a dwell of 1 hour. No channels were lost over this time, the channel-to-channel reliability was excellent and no faceplate wetting was observed.

In contrast, ink 2 comprising tetralin and toluene showed poorer continuous printing performance, as jets were lost over time.

D) Image Quality of Jetted Droplets

Dry time of the printed inks on non-porous Melinex polyester substrate was extremely fast, of the order of seconds.

Throw distances of above 2 mm were not investigated as any printing system that is designed to print electronic materials will be using the minimum throw distance possible in order to minimise any droplet deviation due to inherent print head defects. A typical throw distance for a Litrex printer using an Spectra SX print head would be around 300 microns. This testing demonstrated that even at large throw distance the ink formulations 1a-c showed excellent image quality with no interference due to satellites.

Figure 4:
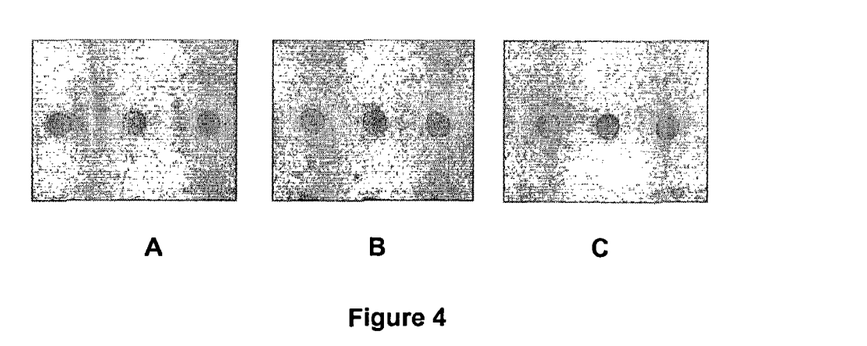
FIG. 4 depicts the image quality of jetted droplets after ink-jet printing of a formulation according to the present invention.

FIG. 4 depicts the image quality of jetted droplets for ink 1a for different throw distance as shown in the table below. As can be seen the droplet size and roundness were constant for all throw distances.

| No. | Throw distance | Droplet Size | Roundness |
| --- | --- | --- | --- |
| 4A | 0.5 mm | 64-66 µm | 0.88-0.92 |
| 4B | 1 mm | 64-66 µm | 0.88-0.92 |
| 4C | 2 mm | 64-66 µm | 0.88-0.92 |

The wetting of the ink on the substrate was good, but not excessive, reproducibly demonstrating printed drops of about 65 microns. Print quality, drop size or drop roundness did not vary as a function of throw distance or waveform up to 2 mm.

To examine the dry time of the ink, the dot pattern was printed at the above 20 m/min print speed, the substrate (Melinex) removed from the transport and then wiped with a gloved finger. In all cases, the ink was dry to the touch indicating a dry time in the order of a few seconds.

The invention is:

1. A formulation comprising one or more polymers wit semiconducting, charge-transport, photoconducting and/or photo- or electroluminescent properties and a solvent, which is indane or a mixture of indane and tetralin, wherein, the polymer concentration is $\leqq 10\%$ by weight and the solvents have a surface tension of from 32 to 40 dynes/cm and a boiling temperature of 160° C. or higher.

2. A formulation according to claim 1, wherein the formulation has a viscosity of less than 6 mPa·s and/or the polymer concentration is $\leqq 3\%$ by weight.

3. A formulation according to claim 1, wherein the solvent is indane.

4. A formulation according to claim 1, wherein the one or more polymers are selected from polythiophenes, polyphenylenevinylenes (PPV), polyarylenevinylenes (PAV), polyfluorenes (PF), polyspirobifluorenes (PSF), polyparaphenylenes (PPP), polypyridines (PPy), polypyrroles, polyvinylcarbazoles, polytriarylamines, and copolymers of the above.

5. A formulation according to claim 1, wherein the one or more polymers are selected from poly-3-substituted polythiophenes.

6. A formulation according to claim 1, wherein the one or more polymers are selected from compounds of formula II

II wherein
n is an integer>1,
$R^1$ is H, halogen, straight chain, branched or cyclic alkyl with 1 to 20 C-atoms, which is unsubstituted, mono- or poly-substituted by F, Cl, Br, I or CN, in which optionally one or more non-adjacent $CH_2$ groups are replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CY$^1$=CY$^2$— or —C≡C— in such a manner that O and/or S atoms are not linked directly to one another, optionally substituted aryl or heteroaryl, or P-Sp,
$R^0$ and $R^{00}$ are independently of each other H or alkyl with 1 to 12 C-atoms,
$Y^1$ and $Y^2$ are independently of each other H, F, Cl or CN,
P is a polymerizable or reactive group which is optionally protected, and
Sp is a spacer group or a single bond.

7. A formulation according to claim 6, wherein $R^1$ is a straight-chain group with 1 to 12 C-atoms.

8. A formulation according to claim 1, wherein the degree of polymerization or n in formula II is an integer from 2 to 5000.

9. A formulation according to claim 5, wherein the polythiophene is regioregular HT-poly-(3-substituted) thiophene with a regioregularity of 95% or more.

10. A printing ink, comprising a formulation according to claim 3.

11. An ink-jet printing ink, comprising a formulation according to claim 1.

12. A semiconducting device or thin film organic transistor, comprising a formulation according to claim 1.

13. A printing ink, comprising a formulation according to claim 1.

14. A semiconductor or charge transport material, component or device, comprising a formulation according to claim 1.

15. A product selected from the group consisting of materials, components and devices that have charge-transport, semiconducting, electrically conducting, photoconducting or light-emitting properties and can be used in optical, electrooptical or electronic components or devices, organic field effect transistors (OFET), integrated circuitry (IC), thin film transistors (TFT), flat panel displays, radio frequency identification (RFID) tags, electroluminescent and photoluminescent devices and components, organic light emitting diodes (OLED), backlights of displays, photovoltaic or sensor devices, charge injection layers, Schottky diodes, planarising layers, antistatic films, conducting substrates and patterns, electrode materials in batteries, photoconductors, electrophotographic applications, electrophotographic recording, organic memory devices, alignment layers, cosmetic and pharmaceutical compositions and for detecting and discriminating DNA sequences, comprising a formulation according to claim 1.

16. An optical, electrooptical or electronic device, FET, integrated circuit (IC), TFT or OLED, comprising a formulation according to claim 1.

17. A product selected from the group consisting of TFT, TFT array for flat panel displays, radio frequency identification (REID) tag, electroluminescent display and backlight comprising a formulation or printing ink according to claim 1.

18. A security marking or device comprising a FET or an RFID tag, which comprises a formulation according to claim 1.

19. A formulation according to claim 1, wherein the solvent is a mixture of indane and tetralin.

* * * * *

UNITED STATES PATENT AND TRADEMARK OFFICE
CERTIFICATE OF CORRECTION

PATENT NO. : 7,510,672 B2  Page 1 of 1
APPLICATION NO. : 11/596847
DATED : March 31, 2009
INVENTOR(S) : McCulloch et al.

It is certified that error appears in the above-identified patent and that said Letters Patent is hereby corrected as shown below:

Column 14, line 52, change "wit" to --with--.

Column 16, line 36, change "(REID)" to --(RFID)--.

Signed and Sealed this

Eighteenth Day of August, 2009

David J. Kappos
*Director of the United States Patent and Trademark Office*